(12) United States Patent
Nguyen et al.

(10) Patent No.: US 10,115,440 B2
(45) Date of Patent: Oct. 30, 2018

(54) WORD LINE CONTACT REGIONS FOR THREE-DIMENSIONAL NON-VOLATILE MEMORY

(71) Applicant: SanDisk Technologies LLC, Plano, TX (US)

(72) Inventors: Qui Nguyen, San Jose, CA (US); Alexander Chu, San Francisco, CA (US); Kenneth Louie, Sunnyvale, CA (US); Anirudh Amarnath, San Jose, CA (US); Jixin Yu, Yokkaichi (JP); Yen-Lung Jason Li, San Jose, CA (US); Tai-Yuan Tseng, Milpitas, CA (US); Jong Yuh, Pleasanton, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/625,848

(22) Filed: Jun. 16, 2017

(65) Prior Publication Data
US 2018/0197586 A1 Jul. 12, 2018

Related U.S. Application Data

(60) Provisional application No. 62/444,793, filed on Jan. 10, 2017.

(51) Int. Cl.
| | |
|---|---|
| *G11C 8/08* | (2006.01) |
| *G11C 5/06* | (2006.01) |
| *H01L 27/112* | (2006.01) |
| *G11C 8/10* | (2006.01) |
| *G06F 13/40* | (2006.01) |

(52) U.S. Cl.
CPC ............ *G11C 8/08* (2013.01); *G06F 13/4072* (2013.01); *G11C 5/06* (2013.01); *G11C 8/10* (2013.01); *H01L 27/112* (2013.01)

(58) Field of Classification Search
CPC ........ G11C 5/063; G11C 7/18; G11C 11/4097
USPC .......................................................... 365/63
See application file for complete search history.

(56) References Cited

U.S. PATENT DOCUMENTS

| | | | |
|---|---|---|---|
| 8,489,817 B2 | 7/2013 | Flynn et al. | |
| 9,013,926 B2 | 4/2015 | Tokiwa | |
| 9,244,833 B2 | 1/2016 | Cheng | |
| 9,589,978 B1 * | 3/2017 | Yip | |
| 2011/0051512 A1 * | 3/2011 | Violette | ... G11C 5/02 365/185.05 |

* cited by examiner

*Primary Examiner* — Huan Hoang
*Assistant Examiner* — Minh Dinh
(74) *Attorney, Agent, or Firm* — Kunzler, PC

(57) ABSTRACT

Apparatuses, systems, and methods are disclosed for three-dimensional non-volatile memory. A stack of word line layers includes word lines for a three-dimensional non-volatile memory array. A stack of word line layers may include a plurality of tiers. Word line switch transistors transfer word line bias voltages to the word lines. Word line contact regions couple word line switch transistors to word lines. A word line contact region includes a stepped structure for a tier of word line layers. A level region separates a word line contact region for a first tier from a word line contact region for a second tier.

16 Claims, 9 Drawing Sheets

WORD LINE CONTACT REGIONS FOR THREE-DIMENSIONAL NON-VOLATILE MEMORY

CROSS-REFERENCES TO RELATED APPLICATIONS

This application claims the benefit of U.S. Provisional Patent Application No. 62/444,793 entitled "MULTI-LANE TERRACE FOR NON-VOLATILE MEMORY" and filed on Jan. 10, 2017 for Qui Nguyen et al., which is incorporated herein by reference.

TECHNICAL FIELD

The present disclosure, in various embodiments, relates to non-volatile memory and more particularly relates to three-dimensional non-volatile memory arrays.

BACKGROUND

Storage capacity for two-dimensional non-volatile memory is limited by the area of a non-volatile memory die. Capacity may be increased by making individual memory cells smaller and closer together within the die area. However, decreasing feature sizes for memory cells may decrease reliability, or disproportionately increase costs. Three-dimensional non-volatile memory provides high capacity and high reliability by stacking layers of memory cells. Connections between layers of memory cells and peripheral circuitry above, below, and/or at the sides of a three-dimensional memory array may be routed through additional metal interconnect layers. However, the number of metal interconnect layers above and/or below a three-dimensional memory array may be small compared to the number of layers of memory cells in the array, so routing within the metal interconnect layers may be dense and complex.

SUMMARY

Apparatuses are presented for three-dimensional non-volatile memory. In one embodiment, a stack of word line layers includes word lines for a three-dimensional non-volatile memory array. In a certain embodiment, a stack of word line layers includes a plurality of tiers. In a further embodiment, a plurality of word line switch transistors transfer word line bias voltages to word lines. In one embodiment, a plurality of word line contact regions couple word line switch transistors to word lines. In a certain embodiment, a word line contact region includes a stepped structure for a tier of word line layers. In a further embodiment, a level region separates a word line contact region for a first tier from a word line contact region for a second tier.

Systems are presented for three-dimensional non-volatile memory. In one embodiment, a system includes a non-volatile memory device, including one or more non-volatile memory elements. In a certain embodiment, a non-volatile memory element includes a three-dimensional non-volatile memory array. In a further embodiment, a three-dimensional non-volatile memory array includes a stack of word line layers, and the word line layers include word lines. In one embodiment, a non-volatile memory element includes a plurality of word line switch transistors for transferring word line bias voltages to word lines. In a certain embodiment, a non-volatile memory element includes a plurality of word line contact regions that include stepped structures for coupling word line switch transistors to word lines. In a further embodiment, a first stepped structure for a first tier of word line layers is disposed apart from a second stepped structure for a second tier of word line layers.

Methods are presented for forming a memory array and peripheral circuitry. In one embodiment, a method includes forming a first tier of word line layers including word lines for a three-dimensional non-volatile memory array. In a certain embodiment, a method includes etching a first stepped structure of word line contacts in a first tier of word line layers. In a further embodiment, a method includes forming a second tier of word line layers. In some embodiments, a method includes etching a second stepped structure of word line contacts, in a second tier of word line layers, such that the second stepped structure is disposed apart from a first stepped structure.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
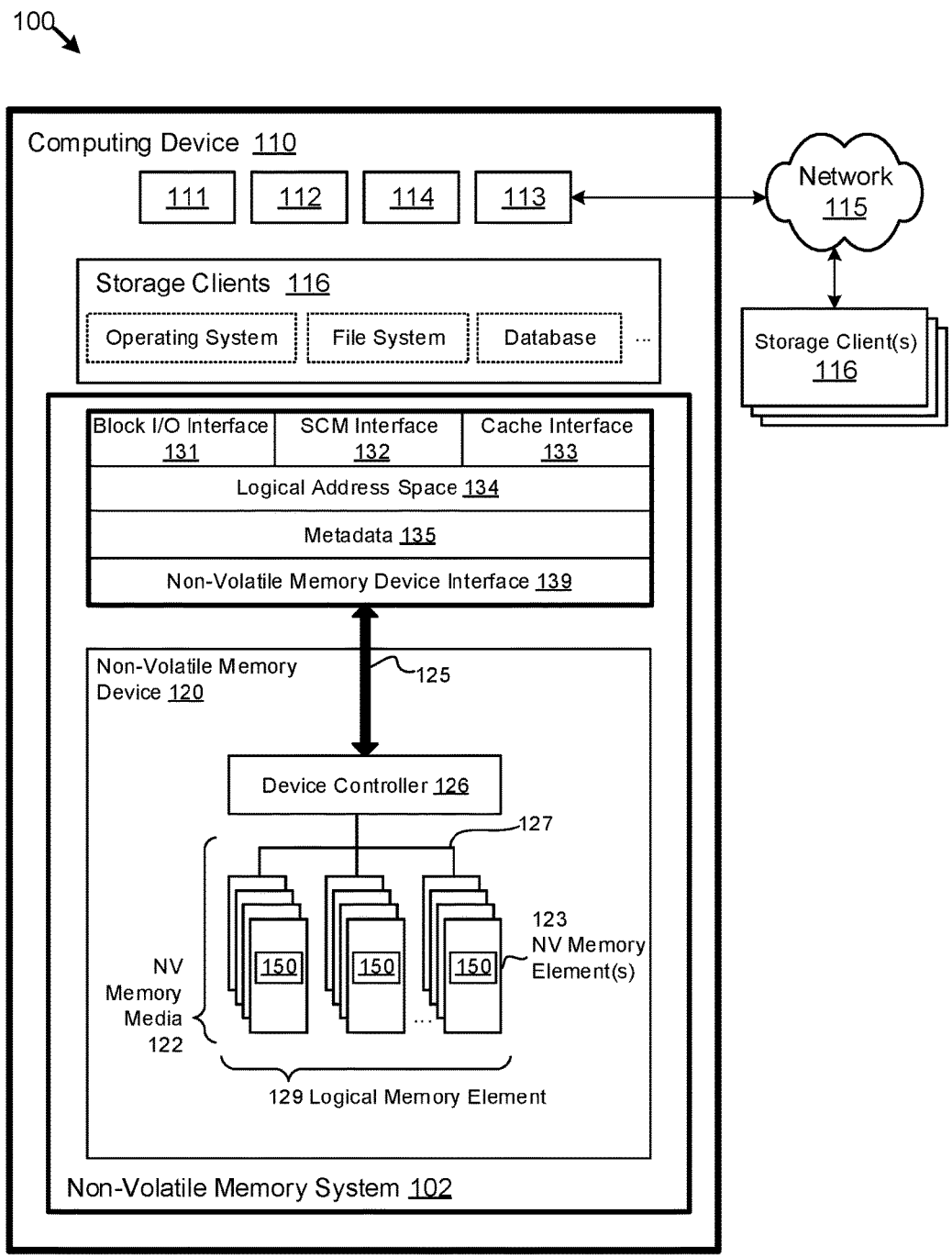
FIG. 1 is a schematic block diagram illustrating one embodiment of a system comprising non-volatile memory elements.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

A circuit, as used herein, comprises a set of one or more electrical and/or electronic components providing one or more pathways for electrical current. In certain embodiments, a circuit may include a return pathway for electrical current, so that the circuit is a closed loop. In another embodiment, however, a set of components that does not include a return pathway for electrical current may be referred to as a circuit (e.g., an open loop). For example, an integrated circuit may be referred to as a circuit regardless of whether the integrated circuit is coupled to ground (as a return pathway for electrical current) or not. In various embodiments, a circuit may include a portion of an integrated circuit, an integrated circuit, a set of integrated circuits, a set of non-integrated electrical and/or electrical components with or without integrated circuit devices, or the like. In one embodiment, a circuit may include custom VLSI circuits, gate arrays, logic circuits, or other integrated circuits; off-the-shelf semiconductors such as logic chips, transistors, or other discrete devices; and/or other mechanical or electrical devices. A circuit may also be implemented as a synthesized circuit in a programmable hardware device such as field programmable gate array, programmable array logic, programmable logic device, or the like (e.g., as firmware, a netlist, or the like). A circuit may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may be embodied by or implemented as a circuit.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising one or more word line contact components 150 for a non-volatile memory device 120. Word line contact components 150 may be part of one or more non-volatile memory elements 123, and may be in communication with a device controller 126 external to the non-volatile memory elements 123, a device driver, or the like. Word line contact components 150 may be part of a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or device controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein.

The non-volatile memory system 102, in the depicted embodiment, includes one or more word line contact components 150. A word line contact component 150, in one embodiment, includes a stack of word line layers comprising word lines for a three-dimensional non-volatile memory array, in a plurality of tiers, a plurality of word line switch transistors for transferring word line bias voltages to the word lines, and a plurality or word line contact regions for coupling the word line switch transistors to the word lines. In various embodiments, a word line contact region may be a stepped structure for a tier of word line layers, and a level region may separate a word line contact region for a first tier from a word line contact region for a second tier.

In certain embodiments, a stack of layers without a stepped structure may expose only the edges of interior layers. Connecting components such as word line switch transistors to a narrow exposed edge may be difficult. By contrast, a stepped structure of word line layers may expose a horizontal portion of each layer, facilitating connections to other components. Additionally, providing separate stepped structures for different tiers of word line layers, with space such as a level region between the stepped structures, may simplify the routing of connections in metal interconnect layers above or below the array. Word line layers, word line switch transistors, and word line contact regions are described in greater detail below with regard to FIGS. 2-10.

In one embodiment, a word line contact component 150 may be used, operated, or controlled by logic hardware of one or more non-volatile memory devices 120, such as a device controller 126, a non-volatile memory element 123, other programmable logic, firmware for a for a non-volatile memory element 123, microcode for execution by a non-volatile memory element 123, or the like. In another embodiment, a word line contact component 150 may be used, operated, or controlled by executable software code, stored on a computer readable storage medium for execution by logic hardware of a non-volatile memory element 123. In a further embodiment, a word line contact component 150 may be used, operated, or controlled by a combination of both executable software code and logic hardware.

In one embodiment, the non-volatile memory device 120 is configured to receive storage requests from a device driver or other executable application via buses 125, 127, a device controller 126, or the like. The non-volatile memory device 120 may be further configured to transfer data to/from a device driver and/or storage clients 116 via the bus 125. Accordingly, the non-volatile memory device 120, in some embodiments, may comprise and/or be in communication with one or more direct memory access (DMA) modules, remote DMA modules, bus controllers, bridges, buffers, and so on to facilitate the transfer of storage requests and associated data. In another embodiment, the non-volatile memory device 120 may receive storage requests as an API call from a storage client 116, as an IO-CTL command, or the like.

According to various embodiments, a device controller 126 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the device controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective device controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more device controllers 126.

A device driver may present a logical address space 134 to the storage clients 116 through one or more interfaces. As discussed above, the logical address space 134 may comprise a plurality of logical addresses, each corresponding to respective media locations the on one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the device controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The device controller 126 is part of and/or in communication with one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like. Similarly, a non-volatile memory element 123, in various embodiments, may comprise a non-volatile recording element, a non-volatile memory element, a non-volatile storage element, or the like.

The non-volatile memory media 122 may comprise one or more non-volatile memory elements 123, which may include, but are not limited to: chips, packages, planes, die, or the like. A device controller 126, external to the one or more non-volatile memory elements 123, may be configured to manage data operations on the non-volatile memory media 122, and may comprise one or more processors, programmable processors (e.g., FPGAs), ASICs, microcontrollers, or the like. In some embodiments, the device controller 126 is configured to store data on and/or read data from the non-volatile memory media 122, to transfer data to/from the non-volatile memory device 120, and so on.

The device controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the device controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The device controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the device controller 126 over a bus 125, as described above.

Figure 2:
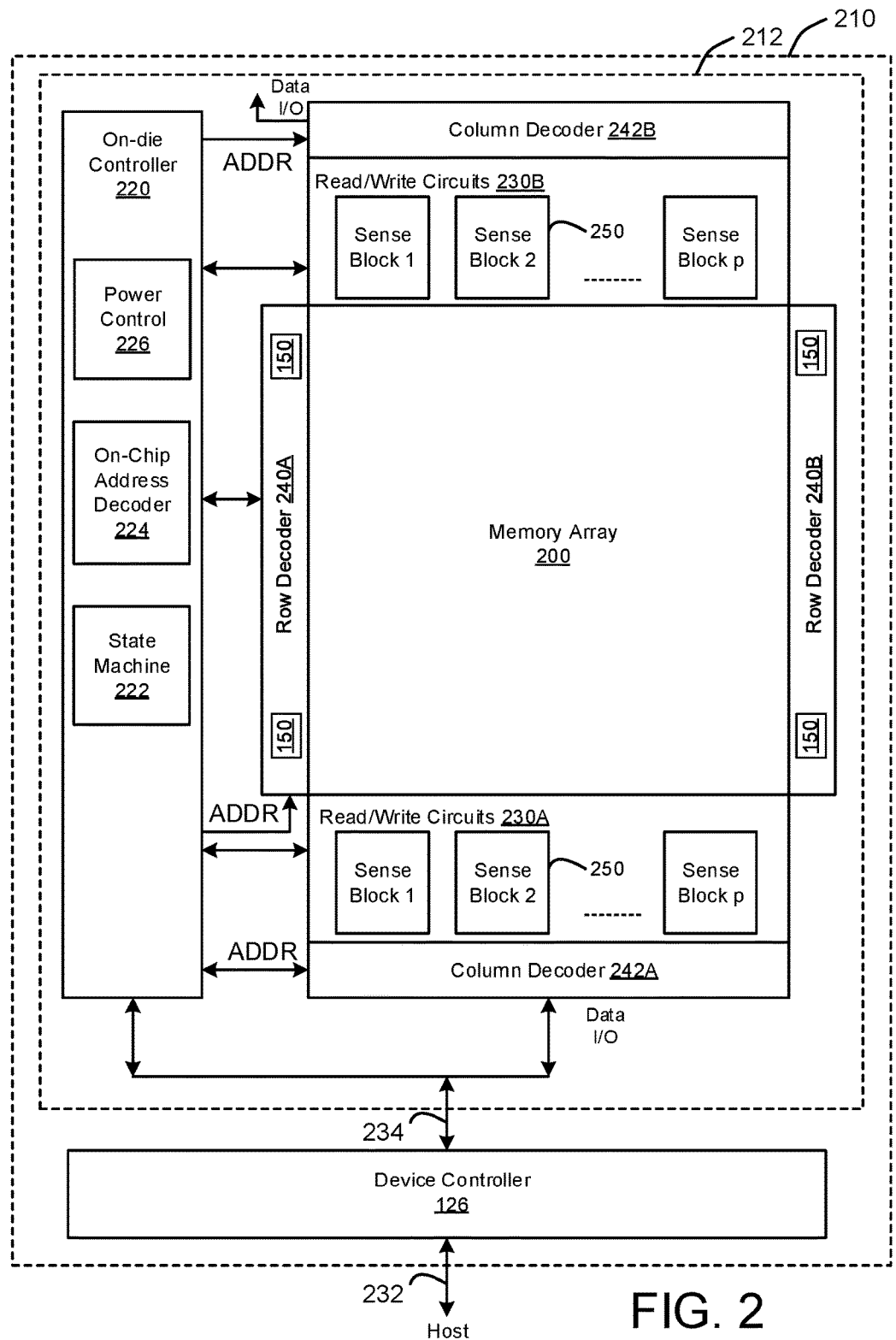
FIG. 2 is a schematic block diagram illustrating another embodiment of a system comprising non-volatile memory elements.

FIG. 2 illustrates an embodiment of a non-volatile storage device 210 that may include one or more memory die or chips 212. A memory die or chip 212 may be a non-volatile memory element 123 as described above with regard to FIG. 1. The nonvolatile storage device 210 may be substantially similar to the nonvolatile memory device 120 described with reference to FIG. 1. Memory die 212, in some embodiments, includes an array (two-dimensional or three-dimensional) of memory cells 200, on-die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel. In the depicted embodiment, peripheral circuits such as row decoders 240A/240B, column decoders 242A/242B, and read/write circuits 230A/230B are disposed at the edges of the memory array. In another embodiment, however, peripheral circuitry may be disposed above, below, and/or at the sides of a three-dimensional memory array 200.

The memory array 200, in various embodiments, is addressable by word lines via row decoders 240A/240B and by bit lines via column decoders 242A/242B. In some embodiments, a device controller 126 external to the memory die 212 is included in the same memory device 210 (e.g., a removable storage card or package) as the one or more memory die 212. Commands and data are transferred between the host and the device controller 126 via lines 232 and between the device controller 126 and the one or more memory die 212 via lines 234. One implementation can include multiple chips 212. In the depicted embodiment, the row decoder 240A/240B includes word line contact components 150, which may be substantially as described above with regard to FIG. 1. The word line contact components 150 may include separate stepped structures for coupling word line switch transistors to word line layers for a three-dimensional memory array 200, to control word line voltages.

On-die controller 220, in one embodiment, cooperates with the read/write circuits 230A/230B to perform memory operations on the memory array 200. The on-die controller 220, in certain embodiments, includes a state machine 222, an on-chip address decoder 224, and a power control circuit 226.

The state machine 222, in one embodiment, provides chip-level control of memory operations. The on-chip address decoder 224 provides an address interface to convert between the address that is used by the host or a device controller 126 to the hardware address used by the decoders

240A, 240B, 242A, 242B. The power control circuit 226 controls the power and voltages supplied to the word lines and bit lines during memory operations. In one embodiment, power control circuit 226 includes one or more charge pumps that can create voltages larger than the supply voltage.

In one embodiment, one or any combination of on-die controller 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or device controller 126 can be referred to as one or more managing circuits.

Figure 3:
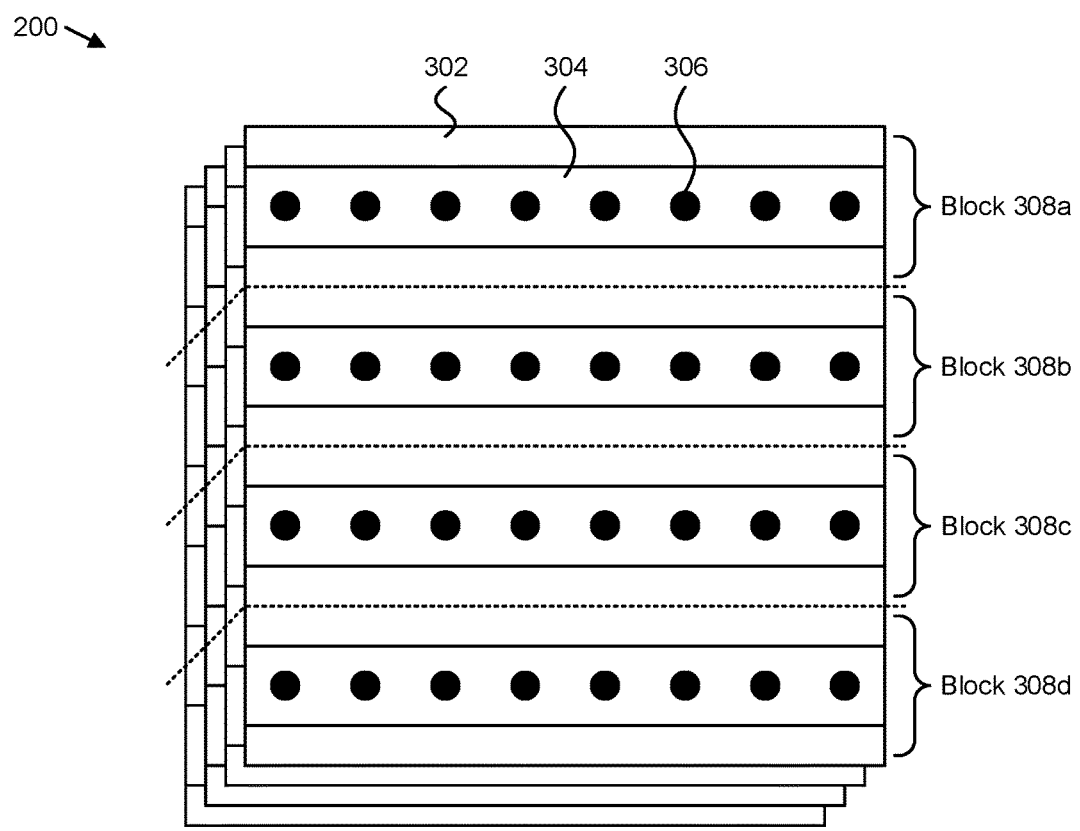
FIG. 3 is a schematic block diagram illustrating one embodiment of a memory array.

FIG. 3 depicts one embodiment of a memory array 200. In various embodiments, the memory array 200 may be substantially as described above with regard to FIG. 2. In the depicted embodiment, the memory array 200 includes word line layers 302, word lines 304, and memory cells 306, organized in blocks 308.

In various embodiments, a memory cell 306 may refer to any component with a physical property that may be altered to store data. For example, a memory cell 306 for NAND memory may be a floating gate transistor, for which the threshold voltage (corresponding to an amount of stored charge on the floating gate) may be altered to store data. Similarly, a memory cell 306 for magnetoresistive memory may be a magnetic tunnel junction, for which a resistance (corresponding to whether two magnetic layers are in parallel or antiparallel states) may be altered to store data. Various types of memory cells 306 for various types of non-volatile memory, such as ReRAM, PCM, MRAM, NAND, and the like, will be clear in view of this disclosure.

In the depicted embodiment, the array 200 is a three-dimensional non-volatile memory array. In various embodiments, a three-dimensional non-volatile array may refer to any array 200 that includes multiple layers of memory cells 306. Each layer of memory cells 306 may include a plurality of rows and columns of memory cells 306, or another two-dimensional arrangement of memory cells 306.

In various embodiments, word lines 304 may be metal (or other conductive) lines that connect a plurality of memory cells 306. For example, in a two-dimensional array, word lines 304 may connect rows of memory cells 306, and bit lines may connect columns of memory cells 306. In a two-dimensional array, writing may involve applying a write voltage to a word line 304 for a row, while applying program or inhibit voltages to individual bit lines, to control which cells 306 of the row are programmed. Similarly, reading may involve applying a read voltage to a word line 304 for a row, and sensing bit line voltages or currents to determine the state of individual cells 306 in the row. As for a two-dimensional array, reading and writing to memory cells 306 of a three-dimensional array 200 may involve transferring a bias voltage (e.g., a read or write voltage) to a word line 304 that connects to multiple cells 306, while addressing individual cells 306 via bit lines. In a certain embodiment, a bit line for a three-dimensional array 200 may vertically couple cells 306 in different layers, so that a bit line current or voltage can be sensed above or below the layers. In a further embodiment, local bit lines may extend through the layers to couple cells 306 in different layers, and may be coupled to global bit lines above or below the array 200.

In the depicted embodiment, word line layers 302 include the word lines 304. In various embodiments, a layer may refer to a substantially flat structure formed or deposited over a substrate (or over another layer). A word line layer 302, in further embodiments, may refer to a layer that comprises (or is) one or more word lines 304. In certain embodiments, the word line layers 302 may include the word lines 304 and memory cells 306. For example, 3D NAND memory cells 306 may be formed by depositing alternating conductive and insulating layers, forming vertical holes through the layers, depositing charge trap material on the walls of the holes, and forming a central conductor through the holes, so that each conductive layer is a word line 304, and the charge trap material where a hole intersects a word line 304 is a memory cell 306. In another embodiment, a layer of MRAM memory cells 306 may be formed, and then a word line layer 302 may be deposited on top of the layer of memory cells 306, so that word lines 304 are above the memory cells 306.

In one embodiment, a word line layer 302 may be a word line 304. For example, in a certain embodiment, a word line layer 302 may be a conductive layer that connects to multiple memory cells 306. In another embodiment, a word line layer 302 may include multiple word lines 304. For example, in the depicted embodiment, a word line 304 connects to a row of memory cells 306, and each word line layer 302 includes multiple word lines 304, so that a stack of rows forms a block 308. In one embodiment, block 308a may be addressed using the first word line 304 in each word line layer 302, block 308b may be addressed using the second word line 304 in each word line layer 302, and so on. In the depicted embodiment, linear word lines 304 are coupled to individual rows of memory cells 306. In another embodiment, however, a first comb-shaped word line 304 may be coupled to odd rows, and a second comb-shaped word line 304 may be coupled to even rows. Various configurations of word lines 304 within a word line layer 302 will be clear in view of this disclosure.

For convenience in depiction, FIGS. 3-9 illustrate an array 200 including a small number of memory cells 306, word lines 304, and word line layers 302. The word line layers 302 are also depicted in exploded form, without intervening or additional layers. However, a memory array 200 may include intervening layers such as oxide or dielectric layers between the word line layers 302 to prevent shorts between word lines 304, additional layers such as metal interconnect layers, and the like. Moreover, a memory array 200 may include tens or hundreds of word line layers 302, correspondingly many word lines 304 (depending on the number of word lines 304 per word line layer 302), and billions of memory cells 306. Sizes of various layers and components in FIGS. 3-9 may not be depicted to scale, as the figures illustrate relations between components rather than the relative size of each component.

In various embodiments, word lines 304 and bit lines are coupled to peripheral circuitry (not shown in FIG. 3) for reading and writing data of the memory cells 306 and writing data to the memory cells 306. In general, in various embodiments, peripheral circuitry may include control components that control word line voltages and bit line voltages, latches for temporarily storing data of a read operation or a write operation, sense amplifiers to detect and amplify bit line voltages or currents, and the like.

Figure 4:
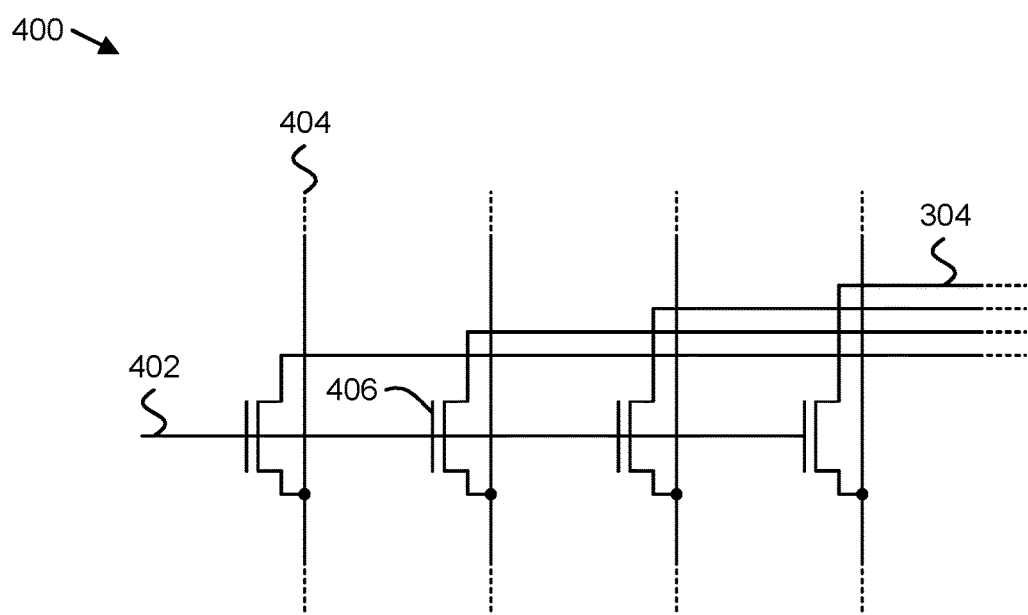
FIG. 4 is an electrical schematic diagram illustrating one embodiment of peripheral circuitry for a memory array.

FIG. 4 is an electrical schematic diagram illustrating one embodiment of peripheral circuitry 400 for controlling word line voltages for a block 308 of a memory array 200. In the depicted embodiment, the peripheral circuitry 400 for controlling word line voltages includes a block select line 402, global bus lines 404, and word line switch transistors 406. In certain embodiments, reading or writing data to a block 308 may include controlling voltages for word lines 304 of the block 308, while controlling bit line voltages to write data, or sensing bit line voltages to read data. Word lines 304 in other blocks 308 may be electrically disconnected or "floating."

The word line switch transistors (WLSTs) 406, in one embodiment, transfer word line bias voltages to the word lines 304. A word line bias voltage may include any voltage applied to a word line 304 for a read operation or a write operation, regardless of whether the word line 304 is coupled to the selected memory cells 306 for the read or write operation. For example, a read operation for selected memory cells 306 may include applying a read voltage to a word line 304 that connects to the selected memory cells 306, and applying another voltage to word lines 304 that connect to unselected memory cells 306, but both the read voltage and the voltage for unselected cells 306 may be referred to as word line bias voltages. The word line switch transistors 406 may include NMOS transistors, PMOS transistors, or any other type of transistors capable of handling word line voltages and currents.

In the depicted embodiment, word line voltages are transmitted on a global bus, comprising a plurality of global bus lines 404. For example, FIG. 4 depicts four word lines 304, and four corresponding global bus lines 404. In certain embodiments, global bus lines 404 may be referred to as control gate interface (CGI) lines, due to word lines 304 being coupled to control gates of NAND memory cells 306. In the depicted embodiment, the word line switch transistors 406 transfer word line bias voltages from the global bus lines 404 to the corresponding word lines 304. The word lines 304 are coupled to drain terminals of the word line switch transistors 406; the global bus lines 404 are coupled to source terminals of the word line switch transistors 406; and a block select line 402 is connected across the gate terminals of the word line switch transistors 406, so that word lines 304 are connected or disconnected to global bus lines 404 based on the whether the block select line 402 turns the word line switch transistors 406 on or off.

In the depicted embodiment, using a global bus to transmit word line bias voltages allows the word line bias voltages to be connected or disconnected to the word lines 304 of different blocks 308, based on block select signals. For example, in one embodiment, each block 308 of a memory array 200 may include a set of word lines 304, as well as word line switch transistors 406 coupled to a block select line 402. Controlling the block select lines 402 may couple or uncouple the word lines 304 of different blocks 308 to the global bus lines 404.

Figure 5:
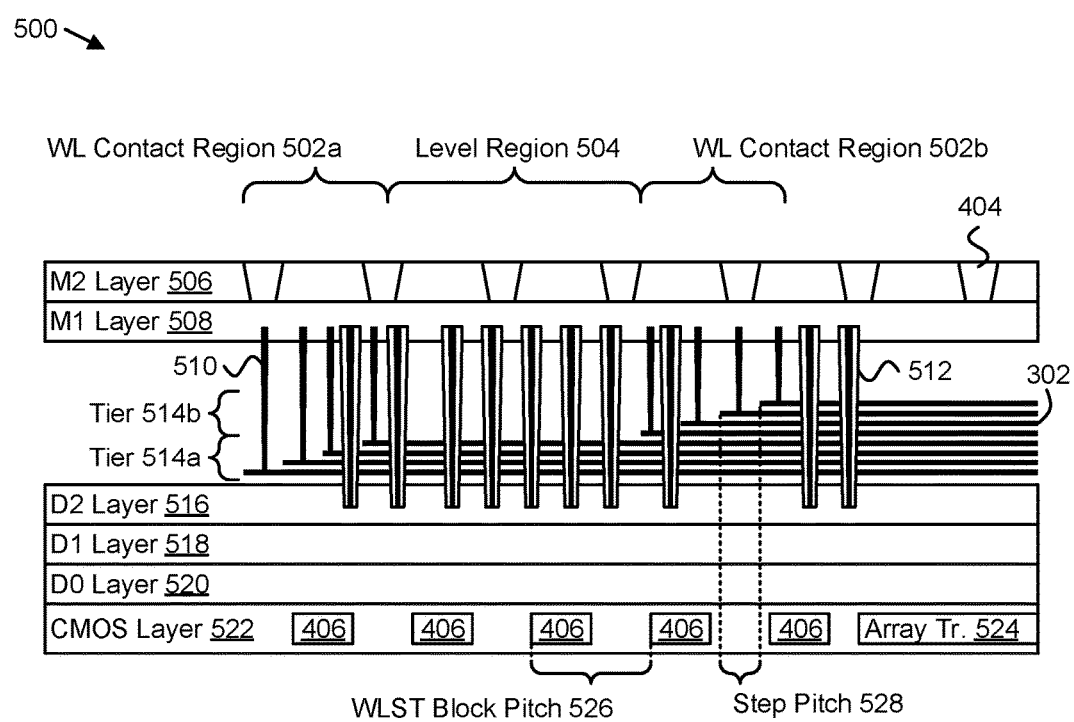
FIG. 5 is a schematic block diagram illustrating another embodiment of peripheral circuitry for a memory array, in a side view.

FIG. 5 depicts a side view of peripheral circuitry 500 for controlling word line voltages of a memory array 200. In the depicted embodiment, a three-dimensional non-volatile memory array 200 includes a stack of word line layers 302, which may be substantially as described above with regard to FIG. 3. The peripheral circuitry 500 may be at one or more sides of the array 200, and include side portions of the word line layers 302. In the depicted embodiment, a non-volatile memory element 123 includes a CMOS layer 522, metal interconnect layers 506, 508, 516, 518, 520, and word line layers 302 (including or coupled to memory cells 306).

In the depicted embodiment, the CMOS layer 522 is a layer of complementary metal-oxide-semiconductor (CMOS) components. CMOS components may include active electronics for controlling word line and/or bit line voltages and currents, sensing bit line voltages and currents, temporarily storing data of a read or write operation (e.g., before or after writing the data to the memory cells 306 of the array 200), and the like. In some embodiments, CMOS components may be disposed to the side of the word line layers 302. In another embodiment, however, a CMOS layer 522 may extend under the memory array 200. In certain embodiments, disposing CMOS components under a memory array 200 may allow an array 200 on a die to occupy nearly the full area of the die. In one embodiment, the CMOS layer 522 includes the word line switch transistors 406, which may be substantially as described above with reference to FIG. 4. In a further embodiment, the CMOS layer 522 includes additional transistors 524 for the array 200. Transistors 524 for the array 200 may include transistors for controlling bit line voltages, and the like.

In various embodiments, metal interconnect layers 506, 508, 516, 518, 520 comprise metal connections that couple components within the non-volatile memory element 123 or die. In the depicted embodiment, the D0 layer 520, D1 layer 518, and D2 layer 516 are disposed under the array 200, and the M1 layer 508 and the M2 layer 506 are disposed above the array 200. Thus, in the depicted embodiment, a non-volatile memory element 123 provides five different metal interconnect layers 506, 508, 516, 518, 520 for connecting components to the array 200. In another embodiment, however, a non-volatile memory element 123 may include more or fewer than five metal interconnect layers 506, 508, 516, 518, 520. In the depicted embodiment, the global bus lines 404 are routed through the M2 layer 506. In another embodiment, the global bus lines 404 may be routed through another metal interconnect layer, through two or more layers, or the like.

The word line layers 302, in the depicted embodiment, include a plurality of tiers 514. As used herein, a "stack" of word line layers 302 may refer to any plurality of word line layers 302 formed or deposited one above the other, and a "tier" may refer to a set of consecutive word line layers 302 within the stack. In the depicted embodiment, the edges of the word line layers 302 are etched to form word line contact regions 502. A word line contact region 502 may refer to a stepped or terraced structure, in which the steps or terraces expose horizontal portions of word line layers 302. A portion of a word line layer 302 may be referred to as "exposed" if it is not covered by word line layers 302 above it. However, an "exposed" portion of a word line layer 302 may still be underneath layers such as the M1 and M2 interconnect layers 506, 508. Exposing horizontal portions of the word line layers 302 allows vertical conductors 510 to be formed that contact the exposed portions, to couple components to the word lines 304. In various embodiments, the word line switch transistors 406 may be coupled to the word lines 304 at the word line contact regions 502.

In certain embodiments, word line contact regions 502 may be formed by selective etching of word line layers 302 (e.g., by photolithography). For example, a tier 514 of word line layers 302 may be deposited, and then a stepped structure may be etched at the periphery of the tier 514. In a certain embodiment, word line contact regions 502 are separate for different tiers 514 of word line layers 302. For example, in the depicted embodiment, word line contact region 502a for tier 514a is separated from word line contact region 502b for tier 514b by a level region 504. A level region 504, in various embodiments, refers to a region that exposes a portion of a word line layer 302, which is larger than the portions that are exposed in the stepped or terraced structure for a word line contact region 502. In certain embodiments, a level region 504 may be analogous to a landing between staircases (where the word line contact regions 502 are analogous to the staircases). In certain embodiment, disposing a word line contact region 502 or stepped structure for a first tier 514 of word line layers 302 apart from a word line contact region 502 or stepped structure for a second tier 514 of word line layers 302 may provide space in between the word line contact regions 502 for routing connections to both word line contact regions 502.

In a certain embodiment, a word line switch transistor region of the CMOS layer 522, which includes the word line switch transistors 406, is disposed under one or more of the word line contact regions 502 for coupling the word line switch transistors 406 to the word lines 304. For example, certain word line switch transistors 406 may be directly underneath the word line contact regions 502. In another embodiment, however, word line switch transistors 406 may occupy more area than the word line contact regions 502, and some word line switch transistors 406 may be under the word line contact regions 502, while other word line switch transistors 406 are in adjacent areas (e.g., under the level region 504).

In one embodiment, a plurality of connectors couple the word line switch transistors 406 to the word lines 304. A connector may include a first vertical conductor 512 that extends between an upper metal interconnect layer and a lower metal interconnect layer for the non-volatile memory, and a second vertical conductor 510 extending between the upper metal interconnect layer and a word line layer 302 exposed at a word line contact region 502.

In various embodiments, terms such as "upper," "lower," "vertical," "horizontal" and the like refer to an orientation in which the layers are horizontally deposited on a substrate. Thus, in certain embodiments, an "upper" metal interconnect layer may refer to a metal interconnect layer that is above the word line layers 302, such as the M1 layer 508 or the M2 layer 506, and a "lower" metal interconnect layer may refer to a metal interconnect layer that is below the word line layers 302, such as the D0 layer 520, the D1 layer 518, or the D2 layer 516. In another orientation, a non-volatile memory element 123 may be turned upside down, so that the "upper" layers are physically below the "lower" layers. However, the terms "upper" and "lower" would still describe the position of the layers relative to the substrate.

In the depicted embodiment, the first vertical conductors 512 extend between the M1 layer 508 and the D2 layer 516. In another embodiment, the first vertical conductors 512 may extend between another upper metal interconnect layer and/or another lower metal interconnect layer. Because the first vertical conductors 512 extend through the word line layers 302, the first vertical conductors 512 may be insulated to prevent electrical contact with the word line layers 302. For example, in one embodiment, the first vertical conductors 512 may be formed by forming a vertical hole, forming or depositing a layer of insulating material in the vertical hole, and forming a central conductor through the vertical hole.

In the depicted embodiment, the second vertical conductors 510 extend from the M1 layer 508 to the word line layers 302, and contact word lines 304 at the word line contact regions 502. In some embodiments, because the second vertical conductors 510 extend to but not through the word line layers 302, the second vertical conductors 510 may be non-insulated. In another embodiment, however, the second vertical conductors may be insulated like the first vertical conductors 512.

In one embodiment, a connection between a word line switch transistor 406 and a word line 304 may include a first vertical conductor 512 and a second vertical conductor 510. Metal interconnects in one or more of the lower metal interconnect layers may couple the word line switch transistor 406 to the first vertical conductor 512. For example, in the depicted embodiment, interconnects in the D0 layer 520 and the D1 layer 518 may couple the end of the first vertical conductor 512 (in the D2 layer 516) to a word line switch transistor 406 in the CMOS layer 522. In another embodiment, the first vertical conductor 512 may directly contact the word line switch transistor 406. For example, the first vertical conductor 512 may extend through the D0 layer 520 and directly contact a word line switch transistor 406 in the CMOS layer 522. The first vertical conductor 512 may transfer a voltage from the word line switch transistor 406 to an upper metal interconnect layer, such as the M1 layer 508, and may be coupled within the upper metal interconnect layer to a second vertical conductor 510 that transfers the voltage to a word line 304 at a word line contact region 502.

In a further embodiment, another vertical conductor 512 may couple a voltage from the voltage bus line 404 to a word line switch transistor 406. Thus, in certain embodiments, an electrical connection from a voltage bus line 404 to a word line 304 may include a vertical conductor 512 coupling the voltage bus line 404 to a word line switch transistor 406 (controlled by a block select line 402 as described above with reference to FIG. 4), and a bridge connection coupling the word line switch transistor 406 to a word line 304, where the bridge connection is formed by a first vertical conductor 512 that couples the word line switch transistor 406 to an upper metal interconnect layer, a horizontal conductor within the upper metal interconnect layer, and a second vertical conductor 510 that contacts the word line 304. In a further embodiment, additional vertical conductors 512 in the region above the word line switch transistors 406 may be provided for communication between the array 200 and a plurality of transistors 524 for the array 200 (e.g., transistors for controlling bit lines).

In one embodiment, a step pitch 528 for the word line contact regions 502 may be based on a block pitch 526 for the word line switch transistors 406. As used herein, in various embodiments, a "pitch" refers to a horizontal distance between corresponding points for adjacent components. Thus, a step pitch 528 for a word line contact region 502 refers to a horizontal distance between the edges of adjacent steps (e.g., exposed portions of word line layers 302), and a block pitch 526 for the word line switch transistors 406 refers to a horizontal distance between corresponding points of adjacent word line switch transistors 406. A step pitch 528 for the word line contact regions 502 may be referred to as "based on" on the block pitch 526 for the word line switch transistors 406 if the step pitch 528 is an integer multiple (or division) of the block pitch 526. For example, the step pitch 528 may be equal to the block pitch 526, may be half the block pitch 526, double the block pitch 526, or the like. In one embodiment, basing the step pitch 528 for the word line contact regions 502 on the block pitch 526 for the word line switch transistors 406 may facilitate spacing vertical conductors 510, 512 at regular intervals.

In another embodiment, however, a step pitch 528 for the word line contact regions 502 may be independent of a block pitch 526 for the word line switch transistors 406. In certain embodiments, a process for etching the steps of the word line contact regions 502 may be independent of a process for forming CMOS word line switch transistors 406, and using independent horizontal pitches for each process may result in lower process costs than using related horizontal pitches for the step pitch 528 and the block pitch 526.

Figure 6:
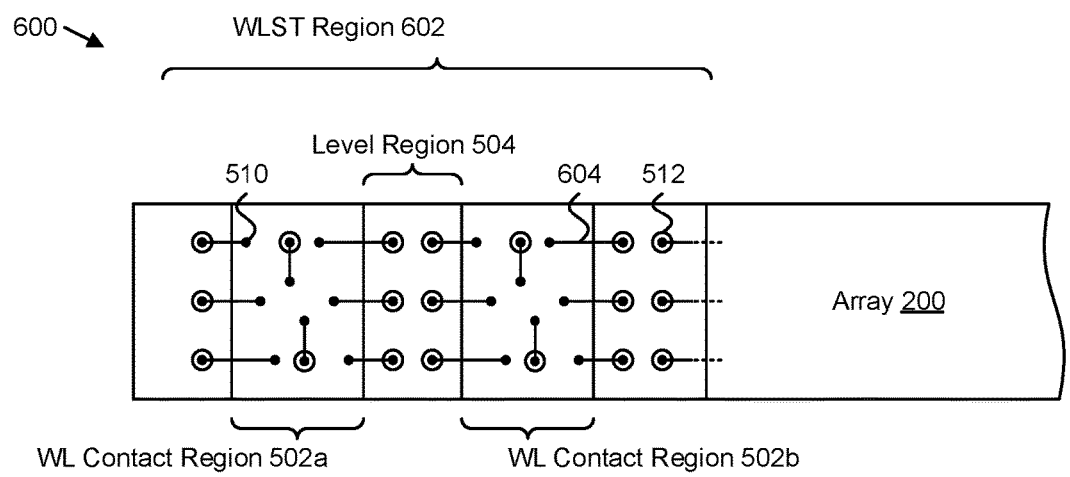
FIG. 6 is a schematic block diagram illustrating another embodiment of peripheral circuitry for a memory array, in a top view.

FIG. 6 depicts another embodiment of peripheral circuitry 600 for a memory array 200, in a top view. The peripheral circuitry 600, in one embodiment, is substantially similar to the peripheral circuitry 500 described above with reference to FIG. 5, and includes word line contact regions 502 separated by a level region 504, first vertical conductors 512, and second vertical conductors 510, substantially as described above.

In the depicted embodiment, the WLST region 602 is a region comprising the word line switch transistors 406. The WLST region 602 is disposed under the word line contact regions 502. In various embodiments, disposing the word line switch transistors 406 at least partially under the word line contact regions 502 may facilitate vertical connections, and reduce the length of horizontal connections in the metal interconnect layers.

As described above, connections from the word line switch transistors 406 to the word lines 304 include first vertical conductors 512 that extend between upper and lower metal interconnect layers, and second vertical conductors 510 that extend from an upper metal interconnect layer to word line layers 302 exposed at the word line contact regions 502. In the top view of FIG. 6, horizontal interconnects 604 between the first vertical conductors 512 and the second vertical conductors 510 are also depicted. For example, in one embodiment, the horizontal interconnects 604 may couple first vertical conductors 512 to second vertical conductors 510 in the M1 layer 508. In the depicted embodiment, the horizontal interconnects 604 form straight, linear connections between vertical conductors 510, 512. In another embodiment, however, the horizontal interconnects 604 may be routed around other interconnects in a metal interconnect layer, may be routed through more than one metal interconnect layer, or the like.

In the depicted embodiment, connectors for a single word line contact region 502 comprise vertical conductors 512 disposed within the word line contact region 502, at a first side of the word line contact region 502, and at a second side of the word line contact region 502. A vertical conductor may be referred to as within a word line contact region 502 if it is disposed within a footprint area for the word line contact region 502. In the depicted embodiment, the second vertical conductors 510 are within the word line contact regions 502 because they directly contact word lines 304 exposed by with word line contact regions 502. However, the first vertical conductors 512 may be disposed within the word line contact regions 502, and/or to multiple sides of the word line contact regions 502. For example, the first vertical conductors 512 for the word line contact region 502a are disposed within the word line contact region 502a, to the left of the word line contact region 502a, and to the right of the word line contact region 502a. In certain embodiments, disposing first vertical conductors 512 within the word line contact regions 502 and to multiple sides of the word line contact regions 502 may facilitate using short horizontal interconnects 604 to the second vertical conductors 510, thus avoiding congestion in the metal interconnect layers. By contrast, if first vertical conductors 512 are all to one side of a word line contact region 502 (e.g., if word line switch transistors 406 are not disposed under the word line contact regions 502), then longer horizontal interconnects 604 may complicate routing in the metal interconnect layers, or may involve additional metal interconnect layers.

In certain embodiments, a distance between adjacent first vertical conductors 512 is smaller between word line contact regions 502 than within word line contact regions 502. For example, in the depicted embodiment, the first vertical conductors 512 are closer together or more densely packed in the level region 504 between word line contact regions 502 than in the word line contact regions 502. In certain embodiments, spacing first vertical conductors 512 more closely between word line contact regions 502 than within word line contact regions 502 may allow space within the word line contact regions 502 to be used for second vertical conductors 510.

FIG. 6 further illustrates vertical conductors 512 for communication between the three-dimensional non-volatile memory array 200 and array transistors 524. For example, in the depicted embodiment, horizontal interconnects 604 from the first vertical conductors 512 at the right of the word line contact region 502b extend toward the array 200, instead of to second vertical conductors 510 that connect to word lines 304.

Figure 7:
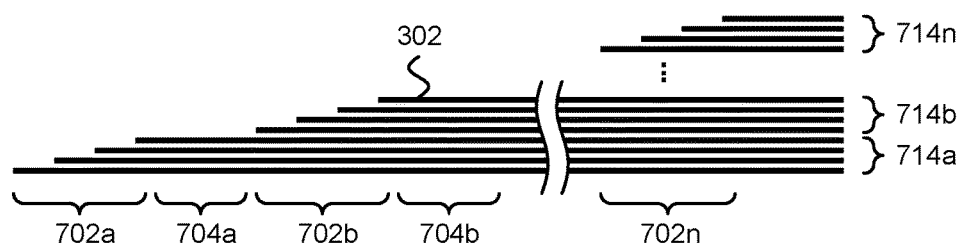
FIG. 7 is a schematic block diagram illustrating another embodiment of peripheral circuitry for a memory array, in a side view.
Figure 8:
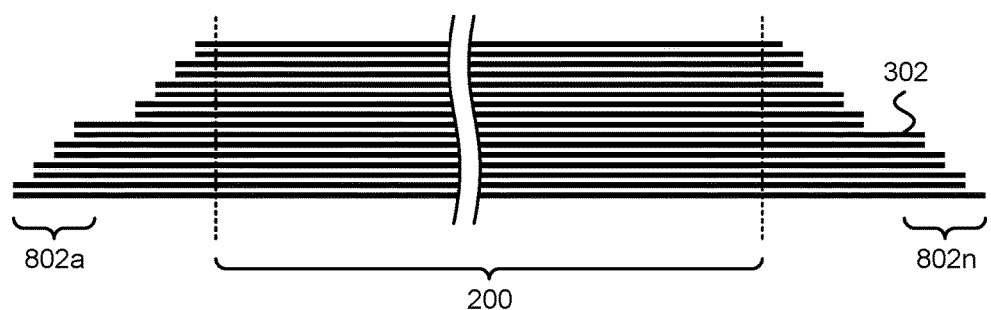
FIG. 8 is a schematic block diagram illustrating another embodiment of peripheral circuitry for a memory array, in a side view.

FIGS. 7 and 8 depict further embodiments of peripheral circuitry 700, 800 for a memory array 200, in a side view. The peripheral circuitry 700, 800 in one embodiment, is substantially similar to the peripheral circuitry 500, 600 described above with reference to FIGS. 5 and 6, including word line layers 302, word line switch transistors 406, metal interconnect layers, vertical conductors and the like. However, FIGS. 7 and 8 depict the word line layers 302 without other components, for convenience in depicting various embodiments of word line contact regions, level regions, and tiers.

As depicted in FIG. 7, peripheral circuitry 700 for an array 200 may include three or more word line contact regions 702 separated by level regions 704. In certain embodiments, word line layers 302 may be formed in three or more tiers 714, such that each tier 714 has a separate word line contact region 702. For example, in the depicted embodiment, word line contact region 702a exposes word line layers 302 for tier 714a; word line contact region 702b exposes word line layers 302 for tier 714b, and so on. As a further example, although the depicted embodiment of FIG. 5 includes two word line contact regions 502 and two tiers 514, another embodiment may include five word line contact regions 702 corresponding to five tiers 714, six word line contact regions 702 corresponding to six tiers 714, or the like.

As depicted in FIG. 8, word line contact regions may be on opposite sides of the array 200. For example, in the depicted embodiment, a word line contact region 802a exposes even word line layers 302 for a first tier, and a word line contact region 802n exposes odd word line layers 302 for the first tier. In a certain embodiment, a word line contact region for a first tier and a word line contact region for a second tier may be disposed at a first side of the array 200 (e.g., at the left side). In a further embodiment, a second word line contact region for the first tier and a second word line contact region for the second tier may be disposed at a second side of the array 200 (e.g., at the right side). In certain embodiments, placing separate word line contact regions for different tiers on one side of the array 200 may simplify routing in the metal interconnect layers above the word line switch transistors 406. Additionally, in further embodiments, placing additional word line contact regions for the tiers (e.g., for odd vs. even word line layers 302, for odd vs. even tiers, or the like) on another side of the array 200 may reduce the overall density of access lines and circuitry.

Figure 9:
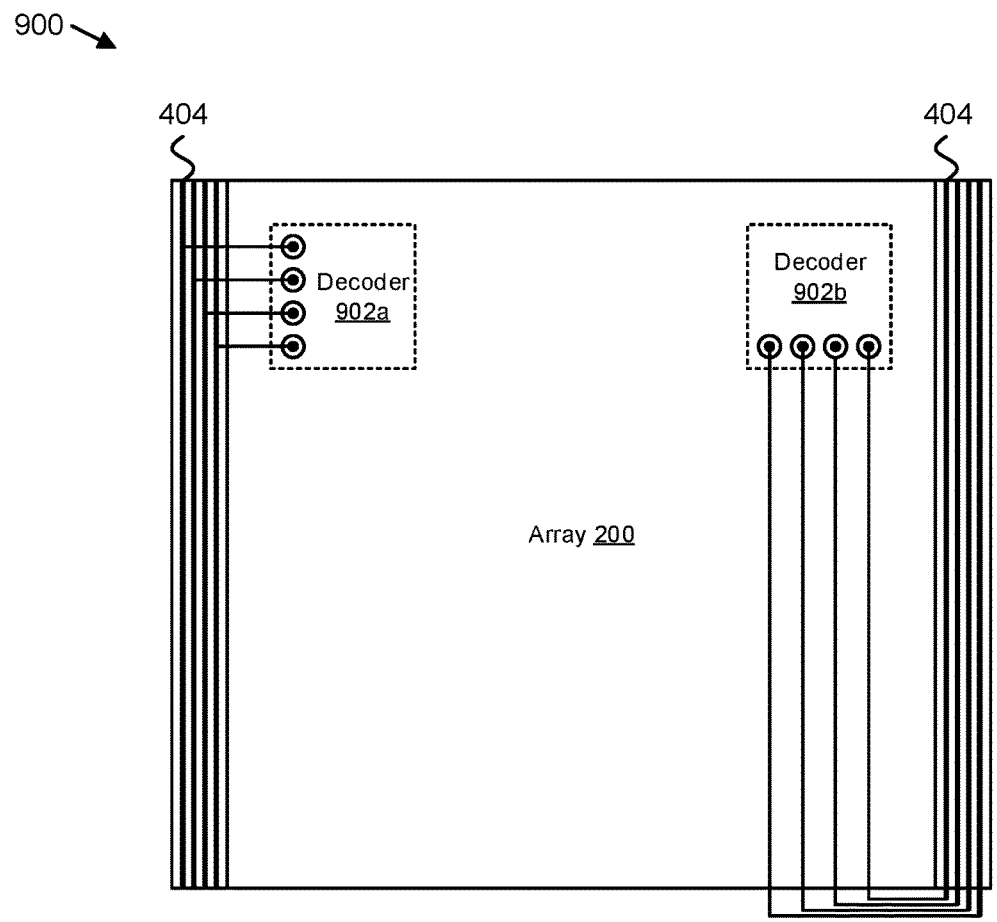
FIG. 9 is a schematic block diagram illustrating another embodiment of peripheral circuitry for a memory array, in a top view.

FIG. 9 depicts another embodiment of peripheral circuitry 900 for a memory array 200, in a top view. In the depicted embodiment, the peripheral circuitry 900 includes one or more decoders 902 that generate the word line bias voltages, and the global bus lines 404 for transmitting the word line bias voltages, which may be substantially similar to the global bus lines 404 described above with reference to FIGS. 4 and 5.

A decoder 902, in various embodiments, may include high voltage switches, high voltage level shifters, and the like, that generate word line bias voltages. In certain embodiments, a decoder 902 may include a demultiplexer that produces a number of bias voltages equal to the number of word lines 304 addressed by a block select line 402, based on pre-decoded signals received on a smaller number of lines. In certain embodiment, a decoder 902 may receive predecoded signals at lower voltages than the word line bias voltages. For example, a predecoded signal for a program pulse may be at a lower voltage that the actual program pulse voltage. In the depicted embodiment, the peripheral circuitry 900 includes word line contact regions and a global bus lines 404 at opposite sides of the array 200, and includes a separate decoder 902 for each array side. In another embodiment, peripheral circuitry 900 may include one decoder 902 for an array 200, four decoders 902 corresponding to quadrants of an array 200, or the like.

In the depicted embodiment, the decoders 902 are disposed under the array 200 (e.g., in the CMOS layer 522 of FIG. 5). In another embodiment, decoders 902 may be disposed to the side of an array 200. However, in certain embodiments, disposing decoders 902 and other CMOS components under the array 200 may allow the array 200 to occupy a greater proportion of the area of a memory die.

In certain embodiments. connections between a decoder 902 and the global bus lines 404 are routed within one or more metal interconnect layers above the three-dimensional non-volatile memory array 200. In various embodiments metal interconnect layers above the three-dimensional non-volatile memory array 200 may include upper metal interconnect layers such as the M1 layer 508 or the M2 layer 506 of FIG. 5, or the like. In certain embodiments, upper metal interconnect layers may include larger conductors than lower metal interconnect layers. Thus, in some embodiments, where high-capacitance word lines 304 may draw large currents, the global bus lines 404 may include comparatively large conductors in an upper metal interconnect layer.

In various embodiments, connecting a decoder 902 under the array 200 to bus lines 404 in an upper metal interconnect layer may involve a vertical connection between the decoder 902, and one or more of the upper metal interconnect layer, and horizontal connection within the upper metal interconnect layer(s). (A horizontal connection may be in-plane within one of the metal interconnect layers, and therefore may appear as a horizontal line or a vertical line in the top view of FIG. 9.) For example, in the depicted embodiment, at the left side of the array 200, connections between the decoder 902a and the bus lines 404 include vertical connections to the M1 layer 508, and horizontal connections that contact the bus lines 404 in the M2 layer 506 (e.g., at contact locations in the interface between the M1 and M2 layers).

In a further embodiment, connections between a decoder 902 and the global bus lines 404 may be routed to a first edge of the array 200, then to the global bus lines 404 at a second edge of the array 200. In various embodiments, an edge of the array 200 may refer to a region at or near a side of the array 200. For example, in one embodiment, word line contacts regions 502 and global bit lines 404 may be at one or more edges of the array 200 in a first direction (e.g., along an "x" axis), and bit line contacts (other than contacts that are directly above or below the array 200) may be at one or more edges of the array 200 in a second direction (e.g., along a "y" axis). In one embodiment, a first edge may be adjacent to a second edge where the global bit lines 404 are located.

For example, in the depicted embodiment, at the right side of the array 200, connections between the decoder 902b and the bus lines 404 include vertical connections to the M2 layer 506, and horizontal connections that run parallel to the bus lines 404 to a first edge of the array 200 (e.g., at the bottom of FIG. 9), and then over to the global bus lines at a second edge of the array 200 (e.g., at the right side of FIG. 9). In certain embodiments, routing connections to another edge of the array 200, instead of directly to the edge where the global bus lines 404 are located, may avoid congested areas of the metal interconnect layers, such as areas that are used for connections to sense amplifiers, or the like.

Figure 10:
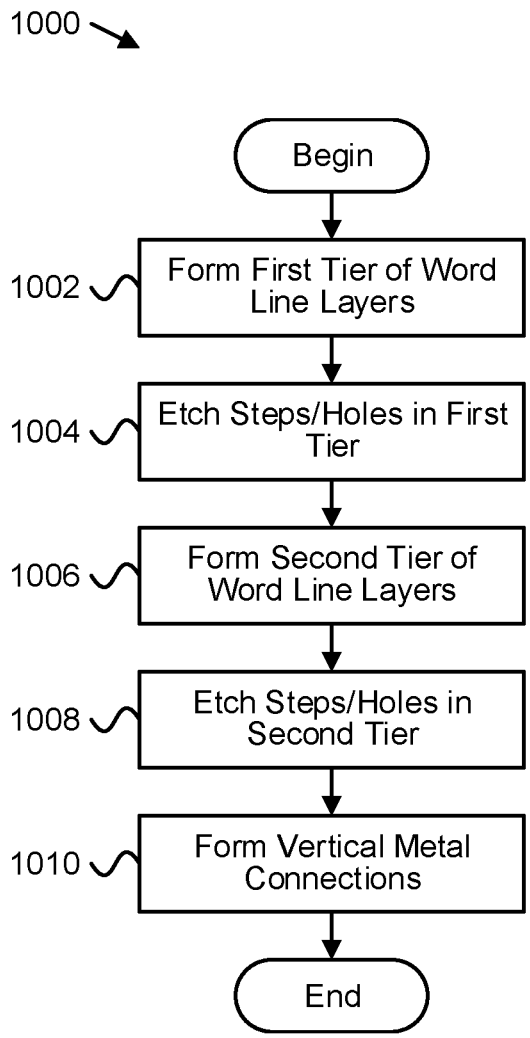
FIG. 10 is a schematic flow chart diagram illustrating one embodiment of a method for forming a memory array and peripheral circuitry.

FIG. 10 is a schematic flow chart diagram illustrating one embodiment of a method for forming a memory array 200 and peripheral circuitry. The method 1000 begins, and a manufacturer forms 1002 a first tier of word line layers. The manufacturer etches 1004 a first stepped structure of word line contacts (e.g., a word line contact region), and holes for vertical conductors, in the first tier of word line layers. The manufacturer then forms 1006 a second tier of word line layers, and etches 1008 a second stepped structure of word line contacts, and holes for vertical conductors, in the second tier of word line layers, such that the second stepped structure is disposed apart from the first stepped structure. The manufacturer forms 1010 vertical metal connections or conductors for coupling word line switch transistors 406 to the word lines at the stepped structures, and the method 1000 ends.

A means for connecting to a row or plane of memory cells 306, in various embodiments, may include a word line 304, a word line layer 302, or the like. Other embodiments may include similar or equivalent means for connecting to rows or planes of memory cells 306.

A means for switching word line bias voltages, in various embodiments, may include word line switch transistors 406, other high voltage switching electronics, or the like. Other embodiments may include similar or equivalent means for switching word line bias voltages.

A means for coupling word lines 304 to word line switching means, in various embodiments, may include a word line contact region 502, a first vertical conductor 512, a second vertical conductor 510, a horizontal interconnect 604, or the like. Other embodiments may include similar or equivalent means for coupling word lines 304 to word line switching means.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a stack of word line layers comprising word lines for a three-dimensional non-volatile memory array, the stack of word line layers comprising a plurality of tiers;
   a plurality of word line switch transistors for transferring word line bias voltages to the word lines;
   a plurality of word line contact regions for coupling the word line switch transistors to the word lines, a word line contact region comprising a stepped structure for a tier of the word line layers, wherein a level region separates a word line contact region for a first tier from a word line contact region for a second tier; and a plurality of connectors coupling the word line switch transistors to the word lines, the connectors comprising vertical conductors, wherein connectors for a single word line contact region comprise vertical conductors disposed within the single word line contact region, at a first side of the single word line contact region, and at a second side of the single word line contact region.

2. The apparatus of claim 1, wherein a tier comprises a set of consecutive word line layers.

3. The apparatus of claim 1, wherein a word line switch transistor region comprising the word line switch transistors is disposed under the word line contact regions.

4. The apparatus of claim 3, further comprising further vertical conductors for communication between the three-dimensional non-volatile memory array and a plurality of transistors for the array, wherein the vertical conductors are disposed above the word line switch transistor region.

5. The apparatus of claim 1, wherein a connector of the plurality of connectors comprises a first vertical conductor extending between an upper metal interconnect layer and a lower metal interconnect layer for the non-volatile memory, and a second vertical conductor extending between the upper metal interconnect layer and a word line layer exposed at one of the word line contact regions.

6. The apparatus of claim 5, wherein a distance between adjacent first vertical conductors is smaller between word line contact regions than within word line contact regions.

7. The apparatus of claim 1, wherein the word line contact region for the first tier and the word line contact region for the second tier are disposed at a first side of the array.

8. The apparatus of claim 7, wherein a second word line contact region for the first tier and a second word line contact region for the second tier are disposed at a second side of the array.

9. The apparatus of claim 1, wherein the plurality of word line contact regions comprises three or more word line contact regions separated by level regions.

10. The apparatus of claim 1, wherein a step pitch for the word line contact regions is based on a block pitch for the word line switch transistors.

11. The apparatus of claim 1, wherein a step pitch for the word line contact regions is independent of a block pitch for the word line switch transistors.

12. The apparatus of claim 1, further comprising a decoder that generates the word line bias voltages, and a global bus for transmitting the word line voltages, wherein connections between the decoder and the global bus are routed within one or more metal layers above the three-dimensional non-volatile memory array.

13. The apparatus of claim 12, wherein the connections are routed to a first edge of the array, then to the global bus at a second edge of the array.

14. A system comprising:
a non-volatile memory device comprising one or more non-volatile memory elements, wherein a non-volatile memory element comprises:
a three-dimensional non-volatile memory array comprising a stack of word line layers, the word line layers comprising word lines;
a plurality of word line switch transistors for transferring word line bias voltages to the word lines;
a plurality of word line contact regions comprising stepped structures for coupling the word line switch transistors to the word lines, wherein a first stepped structure for a first tier of word line layers is disposed apart from a second stepped structure for a second tier of word line layers; and
a plurality of connectors coupling the word line switch transistors to the word lines, the connectors comprising vertical conductors, wherein connectors for a single word line contact region comprise vertical conductors disposed within the single word line contact region, at a first side of the single word line contact region, and at a second side of the single word line contact region.

15. The system of claim 14, wherein a region comprising the word line switch transistors is disposed under the word line contact regions.

16. The system of claim 14, wherein a connector of the plurality of connectors comprises a first vertical conductor extending between an upper metal interconnect layer and a lower metal interconnect layer for the non-volatile memory, and a second vertical conductor extending between the upper metal interconnect layer and a word line layer exposed at one of the word line contact regions.

* * * * *